(12) United States Patent
Levinson et al.

(10) Patent No.: US 6,872,497 B1
(45) Date of Patent: Mar. 29, 2005

(54) REFLECTIVE MASK FOR SHORT WAVELENGTH LITHOGRAPHY

(75) Inventors: Harry Levinson, Saratoga, CA (US); Bruno La Fontaine, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 163 days.

(21) Appl. No.: 10/357,818

(22) Filed: Feb. 4, 2003

(51) Int. Cl.$^7$ ................................................. G03F 9/00
(52) U.S. Cl. ........................................................ 430/5
(58) Field of Search ....................... 430/5, 394; 378/35; 382/144

(56) References Cited

U.S. PATENT DOCUMENTS

| | | | |
|---|---|---|---|
| 6,098,408 | A | 8/2000 | Levinson et al. |
| 6,178,221 | B1 | 1/2001 | Levinson et al. |
| 6,356,340 | B1 | 3/2002 | Spence |
| 6,479,195 | B1 | 11/2002 | Kirchauer et al. |
| 6,583,068 | B2 | 6/2003 | Yan et al. |
| 2003/0123605 | A1 * | 7/2003 | Rau ............................ 378/34 |
| 2003/0194615 | A1 | 10/2003 | Krauth |
| 2004/0091789 | A1 * | 5/2004 | Han et al. ....................... 430/5 |
| 2004/0131947 | A1 * | 7/2004 | Gallagher et al. .............. 430/5 |

OTHER PUBLICATIONS

"Application of Reactive Ion Etching to the Fabrication of Microstructure on Mo/Si Multilayer", Le Zi–Chun, L. Dreeskornfeld, S. Rahn, R. Segler, U. Kleineberg and U. Heinzmann, Chin. Phys. Lett., vol. 16, No. 9, 1999, pp. 665–666.

"Soft X–Ray Projection Imaging with Multilayer Reflection Masks", Masaaki Ito, Hiroaki Oizumi, Takashi Soga, Hiromasa Yamanashi, Taro Ogawa, Soichi Katagiri. Eiichi Seya and Eiji Takeda. Elsevier Science B.V.. Mciroelectronic Engineering 27, 1995, pp. 285–290.

"Reactive Ion Etching of Multilayer Mirrors for X–Ray projection Lithography Masks", C. Khan Malek, F. R. Ladan, M. Carre and R. Rivoira, Elsevier Science Publishers B.V., Microelectronic Engineering 13, 1991, pp. 283–286.

"Application of E–Beam Lithography and Reactive Ion Etching to the Fabrication of Masks for Projection X–Ray Lithography", C. Khan Malek, F.R. Ladan, R. Rivoira, and T. Moreno, American Vacuum Society, Nov./Dec., 1991, pp. 3315–3318.

"Reflective Mask Technologies and Imaging Results in Soft X–Ray Projection Lithography", D.M. Tennant, J.E. Bjorkholm, R.M. D'Souza, L. Eichner, R.R. Freeman. J.Z. Pastalan. L.H. Szeto. O.R. Wood II. T.E. Jewell. W.M. Mansfield, W.K. Waskiewiza, D.L. White, D.L. Windt and A.A. MacDowell, American Vacuum Society, Nov./Dec., 1991, pp. 3176–3183.

* cited by examiner

*Primary Examiner*—S. Rosasco

(57) ABSTRACT

A methodology for forming a reflective mask is disclosed. The mask facilitates accurate pattern transfers as a substantially defect free reflective coating is formed therein. The mask can generally be formed according to four main steps, for example, which include depositing a reflective coating (e.g., formed of multiple layers) over a substrate, patterning and then inspecting for defects a masking material formed over the reflective coating, correcting such defects and finally patterning the reflective coating with the patterned masking material serving as a guide.

21 Claims, 11 Drawing Sheets

US 6,872,497 B1

REFLECTIVE MASK FOR SHORT WAVELENGTH LITHOGRAPHY

FIELD OF INVENTION

The present invention relates generally to a reflective mask for use in lithography such as extreme-UV (EUV) lithography, and more particularly to a methodology for making the same.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller feature sizes are required. This may include the width and spacing of interconnecting lines and the surface geometry such as the corners and edges of various features.

The requirement of small features with close spacing between adjacent features requires high resolution photolithographic processes. In general, lithography refers to processes for pattern transfer between various media. With regard to semiconductor fabrication, a silicon slice (e.g., a wafer) is coated uniformly with a radiation-sensitive film of material (e.g., a resist). The coated substrate can be baked to evaporate solvents in the resist composition and to fix the resist coating onto the substrate. An exposing source (e.g., light, x-rays, an electron beam) can then be utilized to illuminate selected areas of the surface of the film through an intervening master template (e.g., a mask or reticle) to affect the transfer of a pattern formed within the template onto the wafer. The lithographic coating is generally a radiation-sensitized coating suitable for receiving a projected image of the subject pattern. Once the image from the intervening master template is projected onto the resist coating, it is indelibly formed therein.

Light projected onto the resist layer during photolithography changes properties (e.g., solubility) of the layer of material such that different portions thereof (e.g., the illuminated or un-illuminated portions, depending upon the type of resist utilized) can be manipulated in subsequent processing steps. For example, regions of a negative resist become insoluble when illuminated by an exposure source such that the application of a solvent to the resist during a subsequent development stage removes only non-illuminated regions of the resist. The pattern formed in the negative resist layer is, thus, the negative of the pattern defined by opaque regions of the template. By contrast, in a positive resist, illuminated regions of the resist become soluble and are removed via application of a solvent during development. Thus, the pattern formed in the positive resist is a positive image of opaque regions on the template.

Projection lithography is a powerful and important tool for integrated circuit processing. However, as feature sizes continue to decrease, optical systems are approaching their limits caused by the wavelengths of the optical radiation being utilized. A recognized way of further reducing feature sizes is to lithographically image them with radiation of a shorter wavelength. Extreme ultraviolet (EUV) or "soft" x-rays, which have wavelengths within a range of about 30 to 700 Angstroms (i.e., about 3 to 70 nm), can, for example, be considered as an alternative radiation source in photolithography processing in an effort to achieve desired feature sizes.

EUV lithography may be carried-out, for example, in an EUV lithography system, such as that illustrated in prior art FIG. 1. The prior art system 100 depicted in FIG. 1 is designed to delineate a latent image (not shown) of a desired circuit pattern (e.g., having feature dimensions of 0.18 $\mu$m and less) onto a wafer 102 by illuminating a reflective mask 104 with EUV radiation and having at least a portion of that radiation reflected onto the wafer (e.g., via a system of mirrors). The portion of the radiation reflected onto the wafer 102 corresponds to the desired circuit pattern that is to be transferred onto the wafer 102. FIG. 1 is a simplified schematic representation of such a system wherein certain components are not specifically shown.

By way of example, EUV radiation 106 having a wavelength of 3 nm to 70 nm, for example, can be generated from a light source 108, such as a synchrotron or a laser plasma source that can include optical filtering elements 10 and a reflective condenser 112. The condenser and filtering elements can collect the EUV radiation and project one or more beams 114 onto the reflective mask 104 through a slit (not shown), for example, having a particular width and length. The reflective mask 104 absorbs some of the EUV radiation 116 and reflects other portions of the EUV radiation 118 corresponding to one or more features or circuit patterns formed on the mask. The reflective system can include, for example, a series of high precision mirrors 120 (e.g., concave and/or convex mirrors) which can cause the radiation to converge and/or diverge in projecting a de-magnified or reduced image of the pattern(s) to be transferred onto the resist-coated substrate 102. Typically, the reflective mask 104 and wafer 102 are mounted to stages (not shown) such that a scanner can move the mask 104 and the wafer 102 at respective orientations and speeds relative to one another (e.g., in a step and scan fashion) to effect a desired mask-to-image reduction and to facilitate pattern transfers onto one or more different die on the wafer.

The mask 104 of prior art FIG. 1 is an important component in the EUV lithography system 100. Unlike conventional UV lithography systems which predominately use refractive optics, many EUV lithography systems, such as the system 100 depicted in prior art FIG. 1, utilize reflective optics. The mask 104 is thus a reflective mask that reflects at least some incident EUV radiation to transfer a pattern onto a wafer during a semiconductor fabrication process, as opposed to allowing some of the radiation to pass through selected portions of the mask.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its purpose is merely to present one or more concepts of the invention in a simplified form as a prelude to the more detailed description that is presented later. The present invention pertains to a methodology for making a reflective mask. A substantially defect free patterned mask is formed in four main steps; first by depositing a reflective coating (e.g., formed of multiple layers), second by patterning and then inspecting for defects a masking material formed over the reflective coating, third by correcting such defects and finally by patterning the reflective coating with the patterned masking material serving as a guide. It will be appreciated, however, that other steps and/or sub-steps may be involved with achieving objectives associated with aspects of the present invention.

According to one or more aspects of the present invention, a method of making a reflective lithography mask includes forming a reflective coating that is reflective to lithography radiation on a top surface of a substrate that is substantially absorbent to lithography radiation. A masking material (e.g., a resist) is then formed over the reflective coating and patterned to correspond to a desired circuit layout. The masking material is then tested for defects and such defects are then corrected. The reflective coating is then patterned to correspond to the desired circuit layout with the patterned masking material serving as a guide. Finally, the patterned masking material is removed from the patterned reflective coating to reveal the completed mask.

According to another aspect of the present invention, a method of making a reflective lithography mask includes forming a reflective coating that is reflective to lithography radiation on a top surface of a substrate that is substantially absorbent to lithography radiation. A hardmask is then formed over the reflective coating, and a resist is formed over the hardmask. The resist is patterned to correspond to a desired circuit layout, and the hardmask is then patterned with the resist serving as a guide. The remaining patterned resist optionally is then removed, and the hardmask is tested for defects. Defects found in the hardmask are then corrected, and the reflective coating is patterned to correspond to the desired circuit layout with the patterned hardmask serving as a mask. Finally, the remaining patterned hardmask material is removed from the patterned reflective coating to reveal the completed mask.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
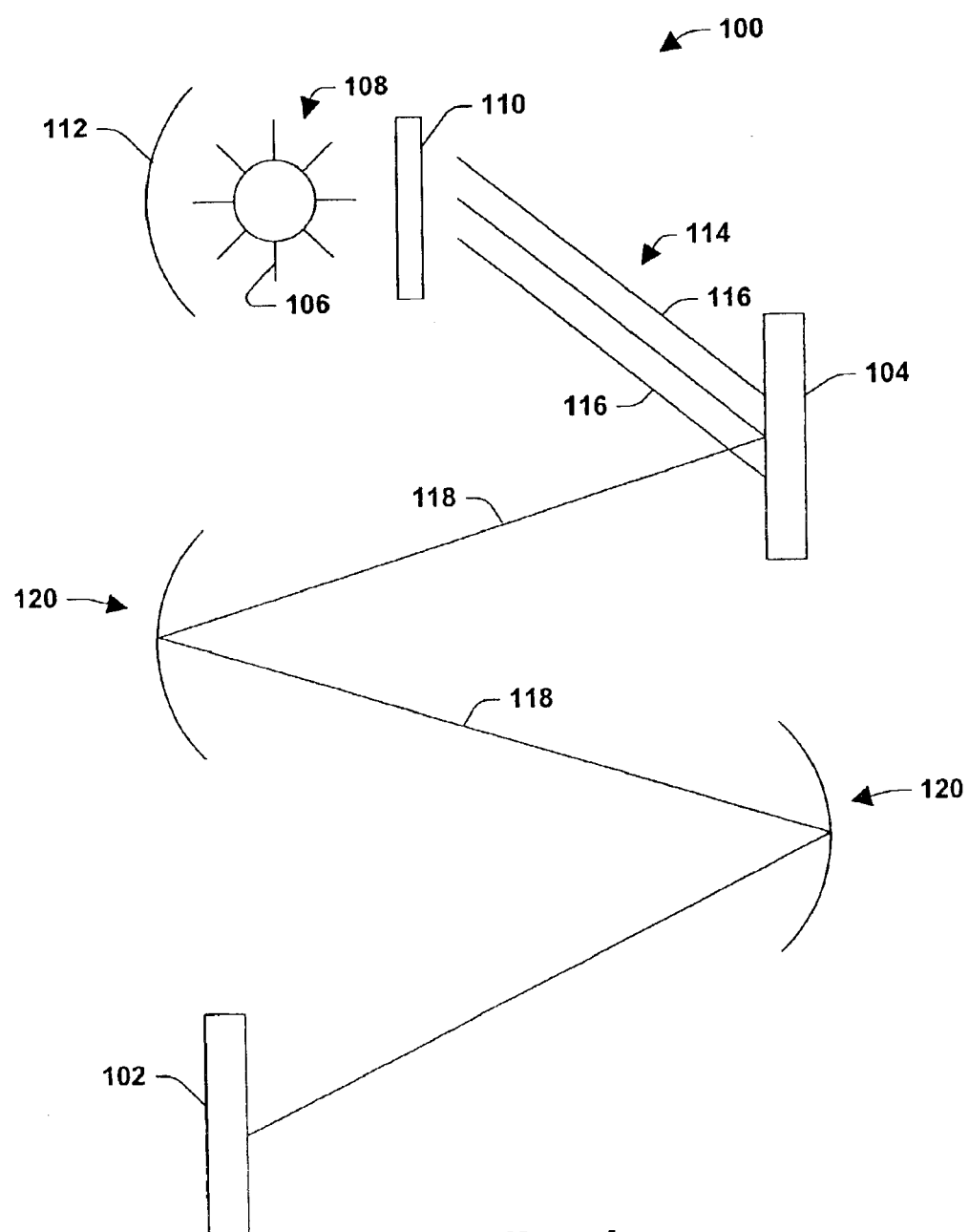
FIG. 1 is a simplified, schematic view of a conventional extreme ultraviolet (EUV) reflective lithography system.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention relate to a methodology for making a reflective mask. The reflective mask can be utilized to transfer a pattern onto a wafer during a semiconductor fabrication process. The mask includes a reflective coating and a substrate over which the reflective coating is formed. The reflective coating reflects radiation (e.g., EUV radiation) and is patterned so as to correspond to a desired circuit pattern. Radiation reflected from the mask thus corresponds to a pattern to be transferred onto wafer(s), and more particularly onto one or more die on wafer(s) during a semiconductor fabrication process. The substrate is absorbent to radiation such that incident radiation is not reflected therefrom, and the pattern formed within the reflective coating is transferred onto wafer(s). The mask is produced by forming the reflective coating so as to be substantially defect free. This allows the mask to affect more accurate pattern transfers. The substantially defect free reflective coating is formed by inspecting a patterned masking material formed over the reflective coating for defects, correcting such defects, patterning the reflective coating with the patterned (and perhaps re-worked) masking material serving as a guide and then removing the residual patterned masking material.

In the examples described below, an EUV reflective mask and the formation thereof is discussed and illustrated. It is to be appreciated, however, that the present invention is equally applicable to reflective masks employed over a broad range of wavelengths, and that all such reflective mask structures and methods associated therewith are contemplated as falling within the scope of the present invention. Additionally, the term substrate is used herein, and that term is intended to include, inter alia, a low-thermal-expansion-material (LTEM) and any other layers formed thereover or associated therewith. It is to be further appreciated that the elements described herein and illustrated in the accompanying figures are depicted with particular dimensions relative to one another (e.g., layer to layer dimensions and/or orientations) for demonstrative purposes and simplicity and ease of understanding, and that the actual dimensions of the elements may differ substantially from that shown and described herein. It is to be still further appreciated that the formation of the many layers shown and described herein can be accomplished in any number of suitable ways, either alone or in combination, such as with spin-on techniques, sputtering techniques (e.g., magnetron or ion beam sputtering) and growth and/or deposition techniques (e.g., chemical vapor deposition (CVD), atomic layer deposition (ALD)).

Figure 2:
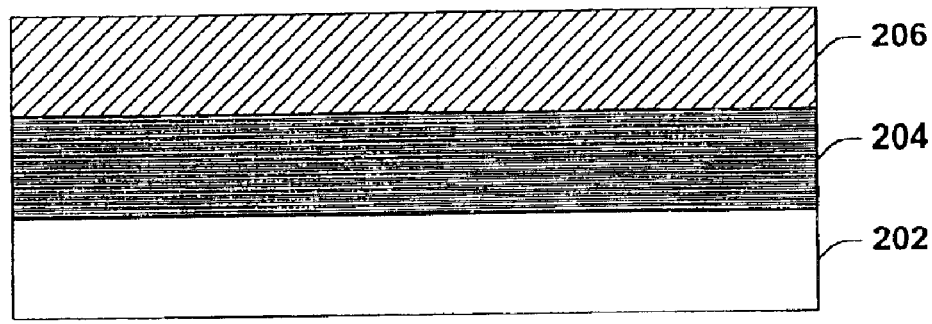
FIGS. 2–6 are cross-sectional illustrations of a conventional EUV reflective mask depicting the fashioning of the mask out of a reticle blank.

Referring now to the drawings in detail and initially to FIGS. 2–6, in order to appreciate various advantageous features of the present invention, the formation of a conventional reflective mask is described. The mask is fabricated from a reticle blank, an exemplary cross-sectional view of which is depicted in FIG. 2. The blank includes a substrate 202, a reflective coating 204 overlying the substrate 202 and an absorbing coating 206 overlying the reflective coating 204. The substrate 202 generally comprises a low-thermal expansion material (LTEM), and the reflective coating 204 includes a material that reflects extreme ultraviolet (EUV) radiation, while the absorbing coating 206 includes a material that absorbs EUV radiation. The absorbing material can include, for example, any one or more of the following, either alone or in combination: chrome, fused silica ($SiO_2$), silver, tungsten, gold, germanium, tungsten, tantalum, tantalum nitride, titanium and titanium nitride.

Figure 3:
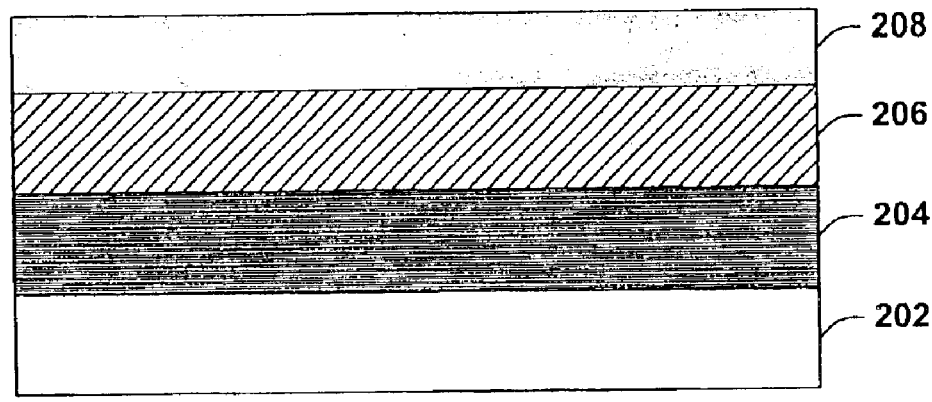
Figure 4:
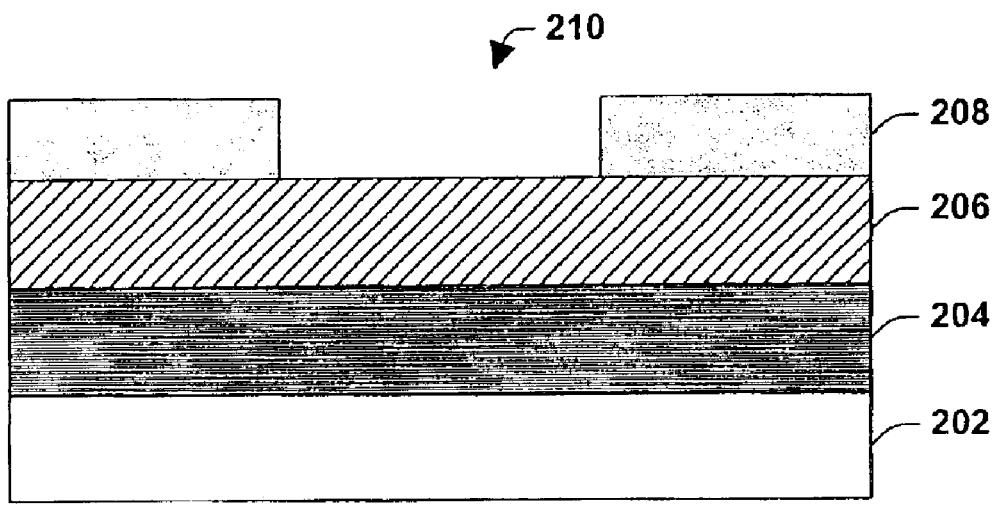

To form the mask from the reticle blank, the surface of the blank (e.g., upper side of the absorbing layer 206) is coated with a resist material 208 (FIG. 3). The layer of resist material 208 is then processed to form desired patterns therein, such as may include an aperture 210, for example (FIG. 4). The patterns correspond to features of circuit designs which are to be subsequently transferred onto associated wafer(s), and more particularly onto individual die on wafer(s), as part of a semiconductor fabrication process. The resist layer 208 can be patterned by selectively exposing it to radiation, which alters one or more of its properties (e.g., solubility) at the selected locations. A solvent can then be applied to the resist coating to remove illuminated or un-illuminated portions, depending upon the type of resist utilized (e.g., positive or negative).

Figure 5:
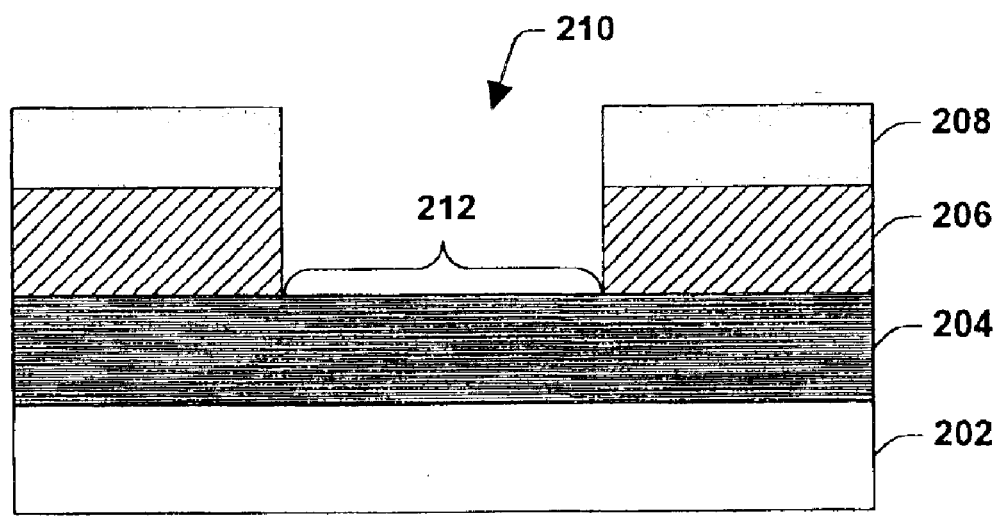

The absorbing layer 206 is then patterned to include the desired features, such as the aperture 210 (FIG. 5). The absorbing layer 206 can be etched, for example, to form the desired features therein, with the resist 208 serving as a mask to facilitate the etching process. The portion(s) 212 of the reflective layer 204 exposed from etching the absorbing layer thus correspond to circuit designs that are to be transferred onto die on a wafer in a semiconductor fabrication process.

Figure 6:
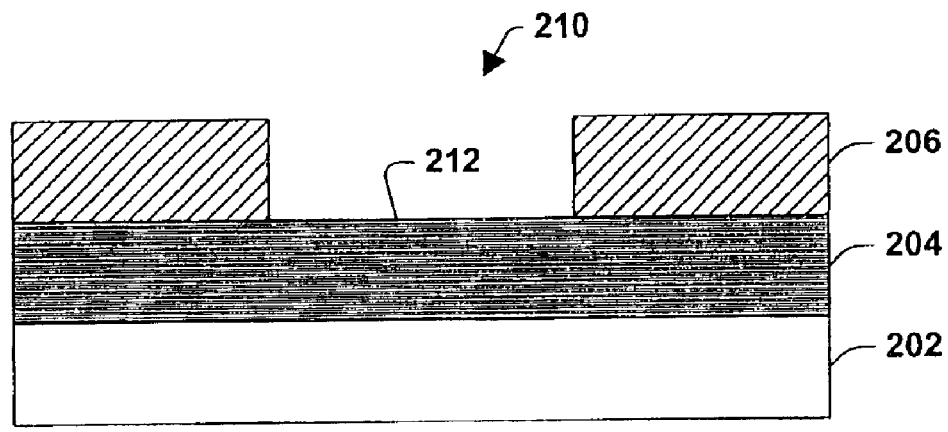
Figure 7:
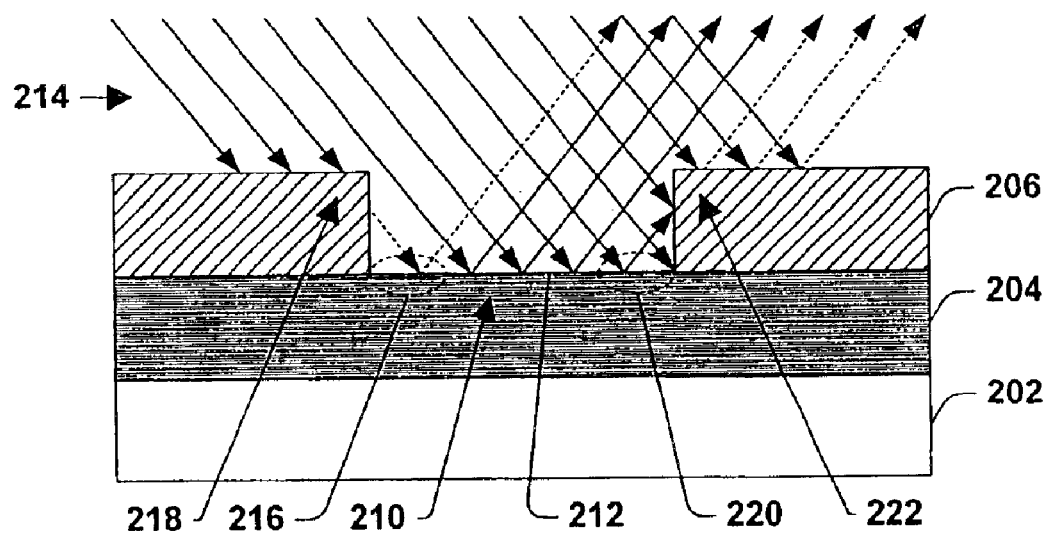
FIG. 7 is a cross-sectional illustration of a conventional EUV reflective mask demonstrating utilization of the mask to reflect EUV radiation.

The remaining resist material 208 is then stripped away to yield the usable reflective mask (FIG. 6). EUV radiation 214 directed at the mask is reflected by the exposed portion 212 of the reflective layer 204 and is absorbed by remaining portions of the absorbing layer 206 (FIG. 7). The reflected EUV radiation thus corresponds to a desired circuit pattern and facilitates transferring the pattern onto an associated wafer (e.g., by interacting with an EUV sensitive coating formed on the wafer).

However, because the EUV light incident on the mask impinges the mask at an angle that is off-normal, as can be seen in FIG. 7, not all areas of the exposed portion(s) 212 of the reflective layer receive EUV radiation 214. For example, an area 216 (encircled in phantom) within the aperture 210 is "shadowed" by the surrounding absorbing material 218. The size of this area 216 is a function of the angle of incidence of the EUV radiation 214 as well as the dimensions (e.g., height) and configuration (e.g., a sharp corner) of the surrounding absorbing material 218. The greater the angle of incidence, and the more material 218 surrounding the feature, the larger the area 216 is that is shadowed from EUV radiation 214. Since EUV radiation does not reach this area 216, it is thus not reflected thereby, and circuit features corresponding to this area will not be transferred onto associated wafers during semiconductor fabrication. The accuracy of pattern transfers is thereby compromised, and resulting semiconductor devices may perform in manners other than as desired. The path of light that would otherwise pass through the surrounding material 218 and be reflected by the exposed portion 212 of the reflective layer 204 is depicted in phantom.

Additionally, with conventional masks, other areas of the exposed portions 212 of the reflective layer 204 may also be deficient with regard to providing radiation to associated wafers during semiconductor fabrication processes. However, these areas do not fail to convey EUV radiation because they never receive the radiation (e.g., as with area 216 which experiences shadowing effects), but because the EUV radiation that they receive (and subsequently reflect) is blocked by surrounding absorbing material. For example, a second area 220 (encircled in phantom) of the exposed portion 212 of the reflective material 204 within the aperture 210 receives incident EUV radiation and reflects the radiation. However, the reflected EUV radiation is absorbed by the adjacent absorbing material 222 and does not escape the mask. The path of reflected radiation that would otherwise pass through surrounding material 222 is depicted in phantom. The size of this area 220 is thus a function of the angle of incidence (which usually equals the angle of reflection as the reflective layer is generally smooth and uniform) as well as the dimensions (e.g., height) and configuration (e.g., a sharp corner) of the surrounding material 222. The greater the angle of incidence (and thus the angle of reflection), and the more absorbing material 222 surrounding the feature, the larger the area 220 from which reflected EUV radiation is trapped by the surrounding absorbing material.

The respective sizes of these unproductive areas or dead zones 216, 220 are usually relatively equal as the angle of incidence typically remains constant across the smooth exposed portion 212 of the reflective layer 204 and the dimensions and configurations of the surrounding absorbing material 218, 222 are also generally equal. Regardless of their symmetry, asymmetry and/or dimensions, however, the effects of these areas 216, 220 mitigate and interfere with the success of pattern transfers as the entirety of features are not reflected onto associated wafers either by not receiving and reflecting all of the incident radiation (e.g., as with area 216) or by receiving and reflecting the EUV radiation, but then having some of that radiation blocked by surrounding absorbing material (e.g., as with area 220).

Figure 8:
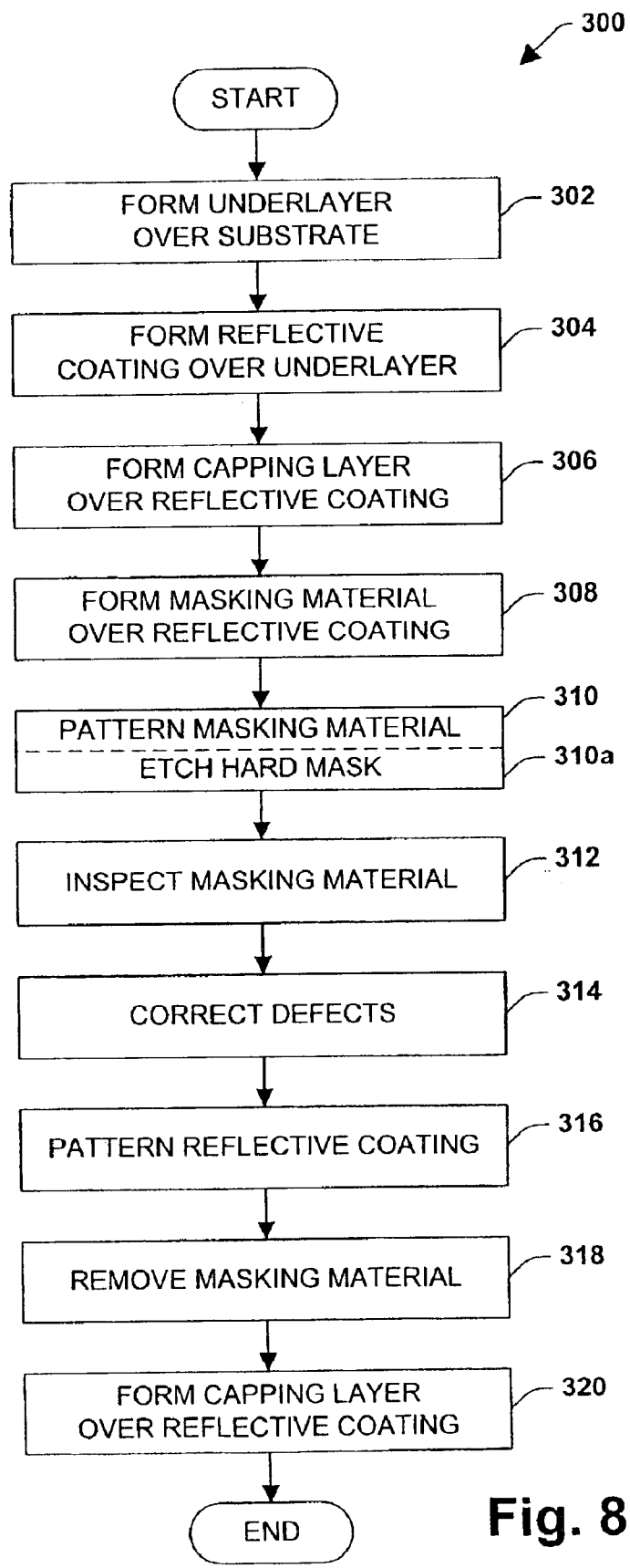
FIG. 8 is a flow diagram illustrating an example of a methodology of fabricating a reflective mask in accordance with one or more aspects of the present invention.

Referring now to FIG. 8, an exemplary methodology 300 is illustrated for fabricating a reflective mask in accordance with one or more aspects of the present invention. Although the methodology 300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated. In one example, the method or variants thereof may be used in the fabrication of a reflective mask, as illustrated and described below with respect to FIGS. 9–20.

The methodology begins at 302 wherein an optional under-layer is formed over the substrate. The under-layer can be utilized, for example, to smooth out defects or rough surfaces in the substrate, and can include any material(s) suitable to accomplish the same. The substrate generally includes a material that has a low coefficient of thermal expansion (e.g., between about 5 ppb/° C. and 30 ppb/° C.), can be polished to have a substantial uniformity and flatness, is transmissive to substantially visible, UV or deep-UV radiation and absorbs EUV radiation. The substrate can include, for example, a low-thermal expansion material, such as ULE™, Zerodur™, or a mixed glass composition of 92.6 wt. % $SiO_2$ 7.4 wt. % $TiO_2$.

At 304 a coating of material that is reflective to EUV radiation is then applied to the under-layer or directly to the substrate if no under-layer is utilized. The reflective coating can likewise include any suitable material, but generally comprises a plurality of overlapping reflective materials (e.g., 40–60 bi-layers) to enhance the EUV reflectivity of the coating. By way of example, layers of any one or more of the following, either alone or in combination, can be utilized to reflect EUV radiation having wavelengths between about 2–25 nm, for example, silicon, molybdenum, beryllium, ruthenium and boron carbide. By way of further example, the reflective coating may include eighty (80) layers of alternating molybdenum and silicon, the respective layers having a thickness within a range of about 1–10 nm.

To mitigate undesired optical performance (e.g., poor reflectivity) the respective layers of reflective material are substantially smooth, uniform and defect free, the transition between the layers is abrupt, and the layer-to-layer thickness variation is maintained within a relatively small range, such as 0.005–0.015 nm, for example. The layers are generally formed to provide high reflectance and establish a high-throughput, cost-effective lithography system (e.g., having an EUV reflection efficiency of about 65% or more). It will be appreciated that the reflective coating can be processed further so as to have additional desired properties.

At 306, an optional capping layer can be formed over the reflective coating. Such a capping layer can be utilized to maximize its environmental and chemical stability, for example, and can include any material(s) suitable to effect the same, such as silicon, ruthenium, boron carbide and/or carbon having a thickness greater than those in the reflective coating, for example. The methodology then proceeds to 308 where a masking material is applied to the reflective coating. The masking material can include, for example, a layer of resist material. At 310, the masking material is patterned to include a design corresponding to an integrated circuit. The masking material can be patterned so as to correspond to the desired circuit layout, for example, by selectively exposing it to radiation, which alters one or more of its properties (e.g. solubility). A solvent can then be applied to the resist coating to remove illuminated or un-illuminated portions, depending upon the type of resist utilized (e.g., positive or negative), and to thereby selectively reveal areas of the underlying reflective coating.

The masking material is then inspected at 312 for defects, such as pitting or holes in unremoved areas or the presence of masking material in areas where none should remain. The inspection can be performed, for example, by shining a light or beam of beam of energetic particles onto the mask. Undesired pits or apertures in the masking material may allow a certain degree of light or particles to pass therethrough, depending upon the severity or depth of the defects. This passed through light or particles will be reflected by the underlying reflective coating, thus revealing the presence and location of the defects. As a corollary, excess masking material will inhibit light from encountering the reflective coating, and thus the lack of or reduced intensity of light reflected from the mask at locations where no masking material is to be present will give an indication of the presence of unwanted residual masking material at these locations.

At 314, defects in the masking material are corrected or repaired. By way of example, pits or holes in the masking material can be selectively filled in by localized deposition (e.g., via electron beam, ion beam) of additional masking material. Excess masking material can be removed with a focused ion beam, etc. It will be appreciated that if some of the underlying reflective coating happens to be removed during the removal of excess masking material, the integrity and fidelity of the mask will not be compromised as exposed portions of the underlying reflective coating will be removed during subsequent patterning, as will be appreciated more fully below.

In accordance with an alternative aspect of the present invention, a hardmask can be formed over the reflective coating and the resist material can be formed over the hardmask. This aspect may be suitable, for example, where the resist is itself not sufficiently resistant to etchants utilized in subsequent etching of the reflective coating. This may be the case, for example, where the resist material has an etch selectivity of less than about 5 to 1 relative to the reflective coating. In this aspect, after the resist is patterned, the underlying hardmask is patterned as well (e.g., via etching) at 310a. The remaining portions of the resist material are then stripped away (e.g., via acid washing) to reveal the patterned hardmask. The hardmask can comprise any suitable material(s) (e.g., chrome, Ta, Ti, TaN, W, Al, Cu, C and TaBN) alone or in combination that instill the hardmask with a sufficient resistance to etchants subsequently utilized in patterning the reflective coating (e.g., an etch selectivity of more than about 5 to 1 relative to the reflective coating). The hardmask also has a high contrast at the inspection wavelength (e.g., low reflectance relative to the reflective coating) so as to facilitate testing of the hardmask with light as previously described with respect to the masking material. Detected defects in the hardmask can also be remedied in the manner described above with respect to the masking material.

At 316, the reflective coating is processed or otherwise patterned to include the integrated circuit pattern formed within the masking material. The integrated circuit pattern can, for example, be etched into the reflective coating with the masking material serving as a guide. It will be appreciated that, after the reflective coating is patterned, the exposed portion of the substrate can also be processed (e.g., etched) slightly. This roughens the surface of the exposed portions of the substrate making it less reflective to EUV radiation. At 318, the masking material is removed to reveal the usable mask. An optional final capping layer can be formed over the patterned reflective coating at 320. Such a final capping layer can protect the mask and can include any materials suitable to effect the same, such as Si, Ru, $B_4C$ and/or C either alone or in combination. The methodology ends thereafter. It will be appreciated that the masking material can be removed in any suitable manner, such as by stripping or being washed away with an acidic solvent, for example. It will be further appreciated that the patterning of the reflective coating at 316 may alternatively be performed with a writing tool such as a laser, electron beam, etc., without use of a mask, and any such manner of patterning the reflective coating is contemplated as falling within the scope of one or more aspects of the present invention.

Figure 9:
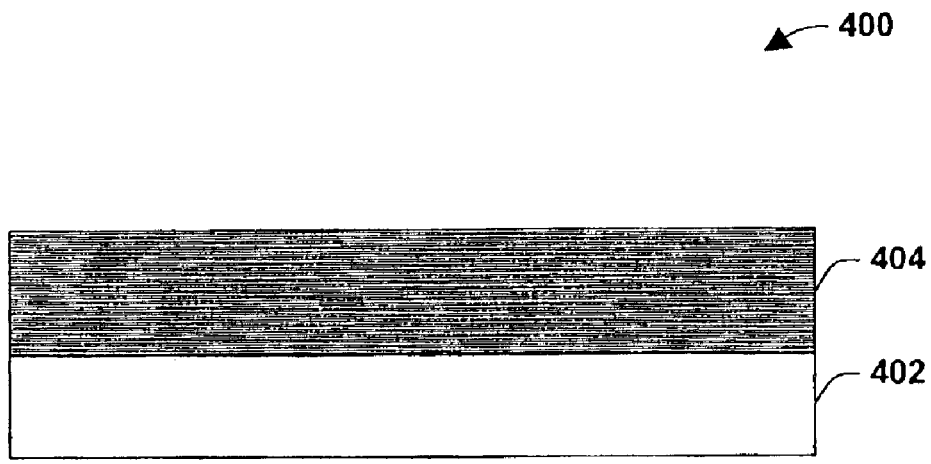
FIGS. 9–17 are cross-sectional illustrations demonstrating fashioning of an EUV reflective mask in accordance with one or more aspects of the present invention.

FIGS. 9–19 ate cross sectional illustrations of a reflective mask fabricated in accordance with one or more aspects of the present invention. Turning to FIG. 9, the formation of the mask 400 begins with a substrate 402 having a reflective coating 404 formed thereover. The substrate 402 can be made of any suitable material, but generally includes a material that has a low coefficient of thermal expansion (e.g., between about 5 ppb/° C. and 30 ppb/° C.) and can be polished to have a substantial uniformity and flatness. The substrate can include, for example, a low-thermal expansion material, such as ULE™, or Zeroduor™, or a mixed glass composition of 92.6 wt. % $SiO_2$ 7.4 wt. % $TiO_2$.

The reflective coating 404 can similarly comprise any suitable material, but generally includes a plurality of overlapping reflective materials (e.g., 40–60 bi-layers). The plurality of layers enhances the EUV reflectivity of the coating. By way of example, layers of any one or more of the following, either alone or in combination, can be utilized to comprise the EUV reflective coating 404: silicon, molybdenum, beryllium, ruthenium and boron carbide. Layers of such materials can be utilized to construct a reflective coating that reflects EUV radiation having wavelengths between about 3–70 nm, for example.

By way of further example, the reflective coating 404 may include eighty (80) layers of alternating molybdenum and silicon, where respective layers have thicknesses within a range of about 1–10 nm. The respective layers of reflective material can also have a layer-to-layer thickness variation that is generally maintained within a relatively small range, such as 0.005–0.015 nm, for example. The layers can also be substantially smooth, uniform and defect free, and the transition between the layers can be relatively abrupt. Such characteristics facilitate desired optical performance with the reflective layer and help to establish a high-throughput, cost-effective lithography system (e.g., having an EUV reflection efficiency of about 65% or more). It will be appreciated that the reflective coating 404 can be processed further so as to have additional desired properties.

It will be appreciated that an optional under-layer (not shown) can be formed over the substrate 402 prior to formation of the reflective coating 404. The under-layer can be utilized, for example, to smooth out defects or rough surfaces on the surface of the substrate 402, and can include any material(s) suitable to accomplish the same.

Figure 10:
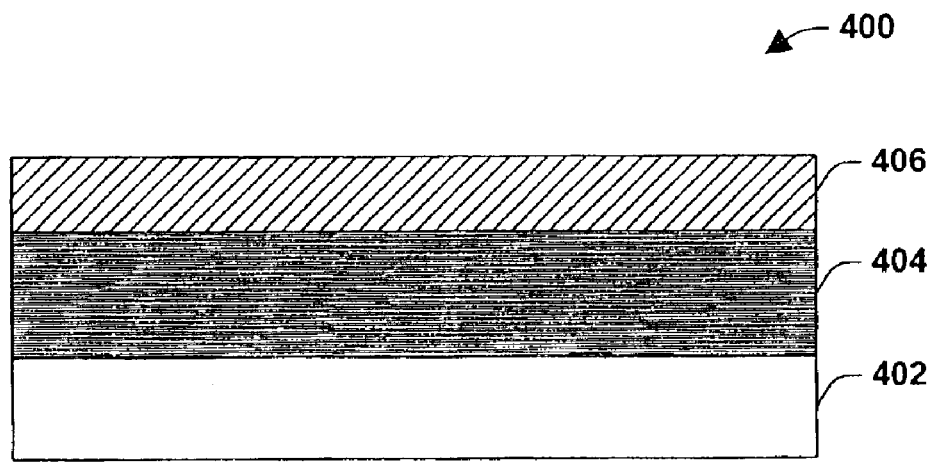

A hardmask 406 is then formed over the reflective coating 404 (FIG. 10). The hardmask can comprise any suitable material(s) (e.g., chrome) alone or in combination that instill the hardmask with a sufficient resistivity to etchants subsequently utilized in patterning the reflective coating (e.g., an etch selectivity of more than about 5 to 1 relative to the reflective coating). The hardmask 406 also has a high contrast at the inspection wavelength so as to facilitate testing of the hardmask, as is discussed in greater detail below.

Figure 11:
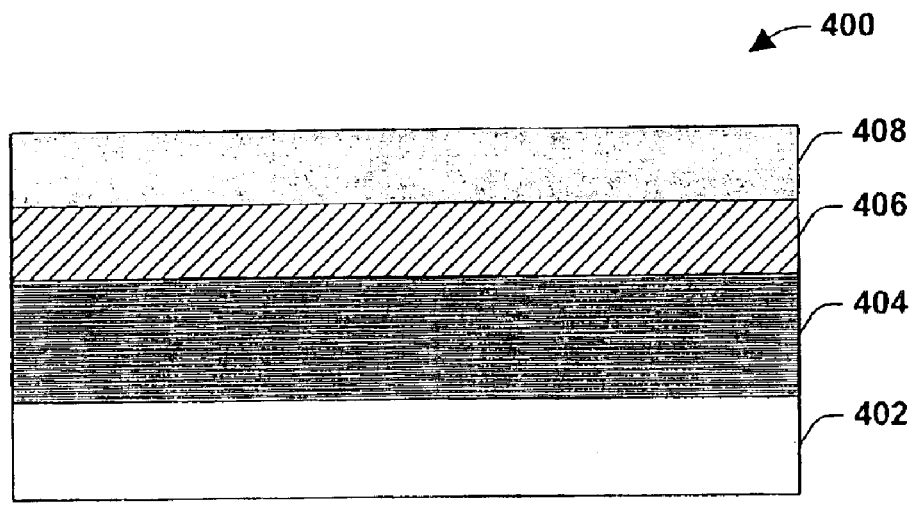
Figure 12:
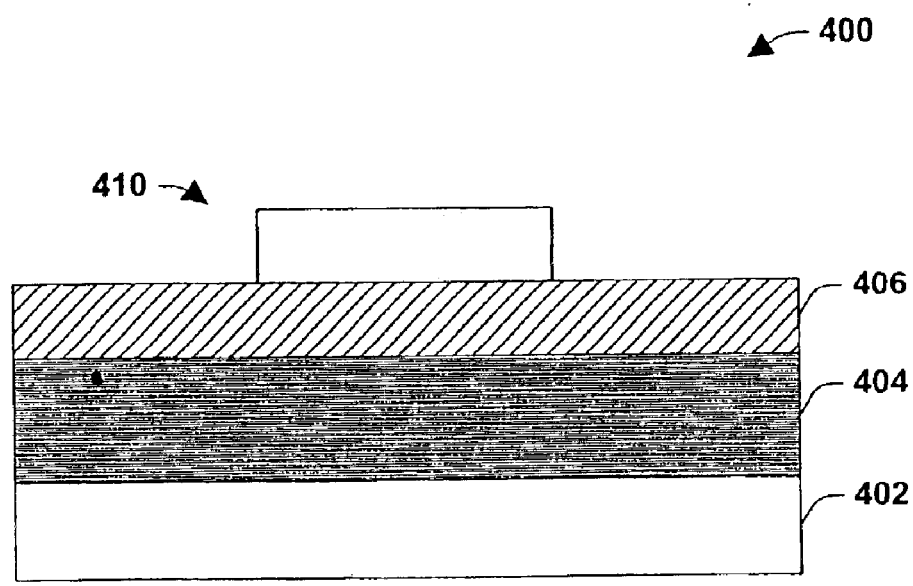

A layer of resist material 408 is then formed over the hardmask 406 (FIG. 11). The resist is sensitive to certain types of radiation such that exposing the resist 408 to these types of radiation changes one or more of its properties (e.g., solubility). Accordingly, the resist is then patterned so as to correspond to a desired circuit layout by selectively exposing it to radiation, and then applying a solvent to the resist to remove illuminated or un-illuminated portions thereof, depending upon the type of resist utilized (e.g., positive or negative) (FIG. 12). It is to be appreciated that while only one feature 410 is depicted in the example illustrated, the mask 400 may comprise any number of features having any number of shapes and sizes to comprise the desired circuit design. It is to be further appreciated that the layer 408 can alternatively be patterned by utilizing the radiation to selectively carve out or remove portions thereof to impart the desired pattern therein.

It will be appreciated that an optional capping layer (not shown) can be formed over the reflective coating 404 prior to forming the hardmask 406 and resist 408 layers thereover. Such a capping layer can be utilized to maximize the environmental and chemical stability of the coating, for example, and can include any material(s) suitable to effect the same, such as silicon, ruthenium$B_4C$, carbon and/or chrome, for example.

Figure 13:
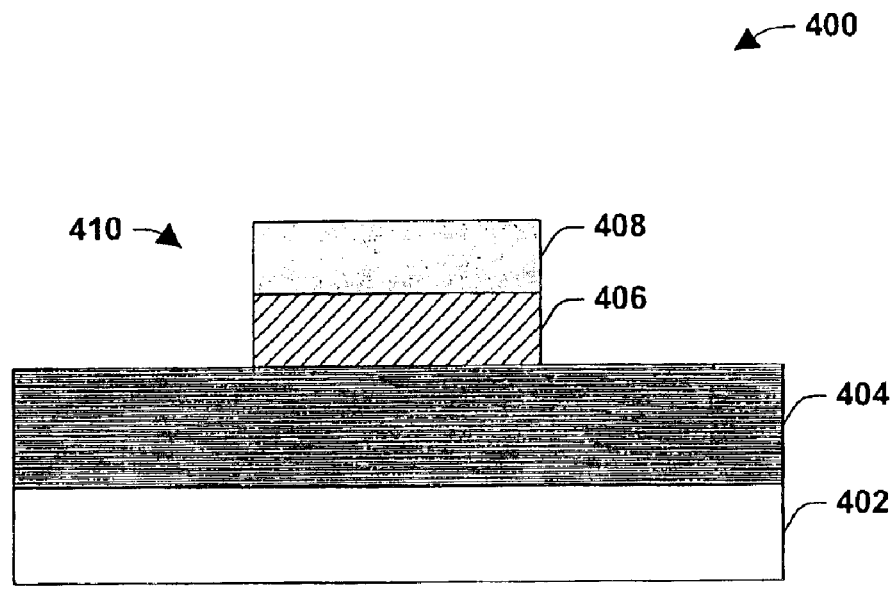

The pattern formed within the resist 408 is then transferred into the hardmask 406 (FIG. 13). The hardmask 406 can be patterned in any suitable manner, such as by etching, for example, with the patterned resist 408 serving as a mask. It will be appreciated that the resist 408 and the hardmask 406 can be said to comprise a masking material as they are utilized to utilized to transfer the feature 410 into the underlying reflective coating 404 and serve masking functions in effecting the same.

Figure 14:
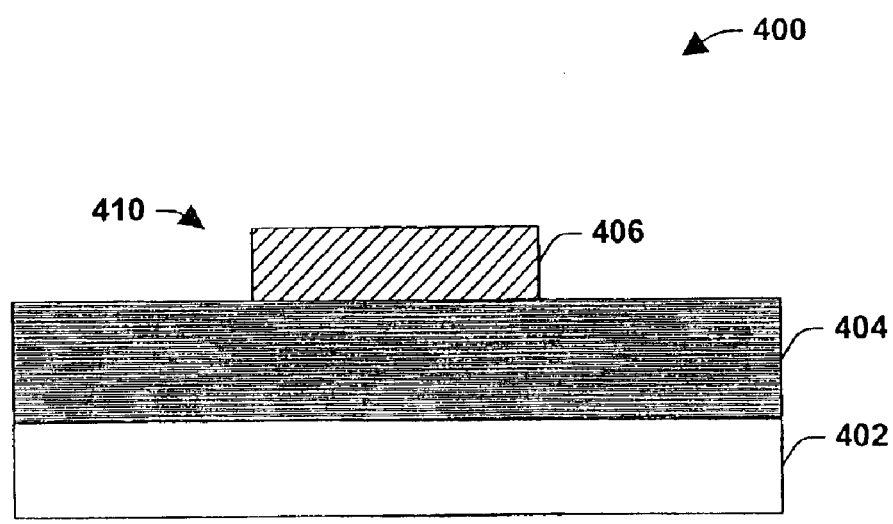
Figure 15:
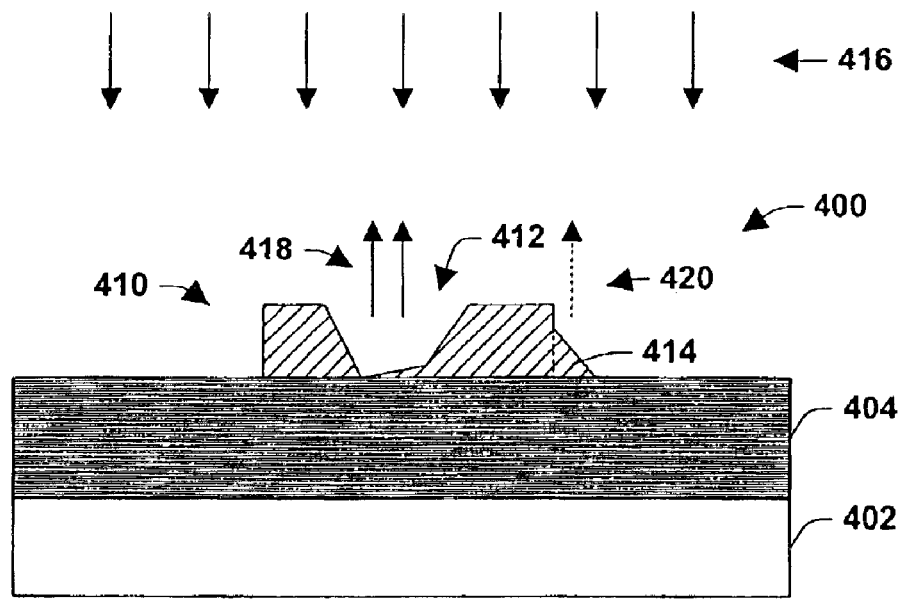

The remaining resist 408 is then removed or stripped away from the mask 400 (e.g., via acid washing) to reveal the patterned hardmask 406 (FIG. 14). The patterned hardmask 406 is then inspected for defects, such as pitting or holes 412 in unremoved areas of the patterned hardmask 406 or the presence of excess hardmask material 414 in areas where none should remain (FIG. 15). It will be appreciated that the defects 412, 414 depicted herein are illustrated for exemplary purposes only and that any number of such defects can exist and can be inspected for and remedied in accordance with one or more aspects of the present invention. Such defects can comprise any size, shape and/or dimensions, etc. for the diagnostic and/or remedial purposes set forth herein.

Inspection of the patterned hardmask 406 can be performed, for example, by shining light 416 onto the mask 400, as illustrated in FIG. 15. Recall that the hardmask 406 has a high contrast relative to the reflective coating 404 at the inspection wavelength (e.g., is substantially non-reflective relative to the reflective coating). Undesired pits or apertures 412 in the hardmask 406 may allow a certain degree of light 416 to pass therethrough, depending upon the severity or depth of the defects. Accordingly, a transmitted portion of this light 418 will be reflected by the underlying reflective coating 404, thus revealing the presence and location of these defects 412. As a corollary, excess hardmask material 414 will inhibit the light 416 from encountering the reflective coating 404, and thus the lack of or reduced intensity of light 420 (depicted in phantom) reflected from the mask 400 at locations where no hardmask material 406 is to be present will give an indication of the presence of the unwanted residual hardmask material 414 at these locations.

Figure 16:
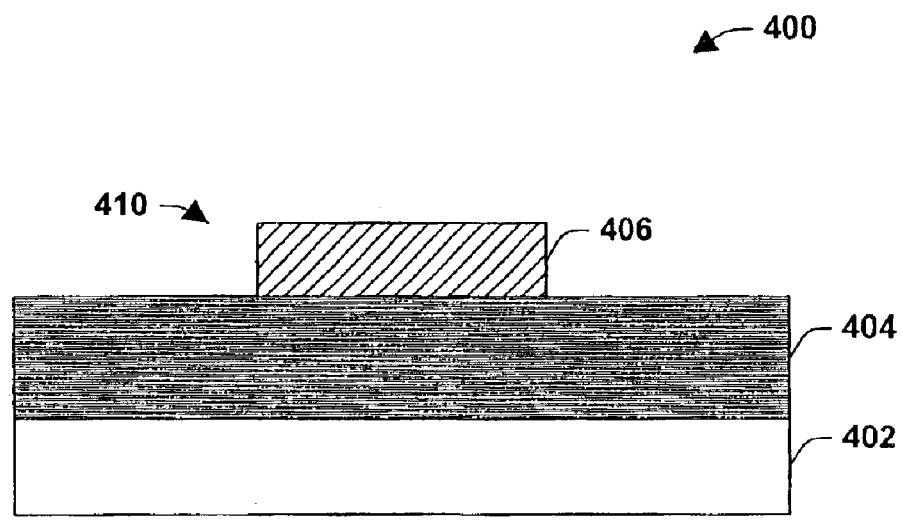

Defects in the hardmask 406 are then corrected prior to patterning the reflective layer 404 to produce a substantially defect free hardmask 406 (FIG. 16). By way of example, pits or holes 412 in the hardmask can be selectively filled in by localized deposition (e.g., via electron beam, ion beam) of additional hardmask material. Excess hardmask material 414 can be removed with a focused ion beam, etc. to selectively etch away the hardmask material 414. It will be appreciated that if some of the underlying reflective coating 404 should happen to be removed during the removal of excess hardmask material 414, the integrity and fidelity of the hardmask will not be compromised as exposed portions of the underlying reflective coating 404 will be removed at that location during subsequent patterning of the reflective coating 404.

In accordance with an alternative aspect of the present invention, it will be appreciated that the hardmask 406 may not be necessary as the resist 408 may serve as the masking material for the underlying reflective coating 404. This aspect may be suitable, for example, where the resist is itself sufficiently resistant to etchants utilized in subsequently etching the reflective coating 404 and can be repaired. This may be the case, for example, where the resist material 408 has an etch selectivity of more than about 5 to 1 relative to the reflective coating 404.

Figure 17:
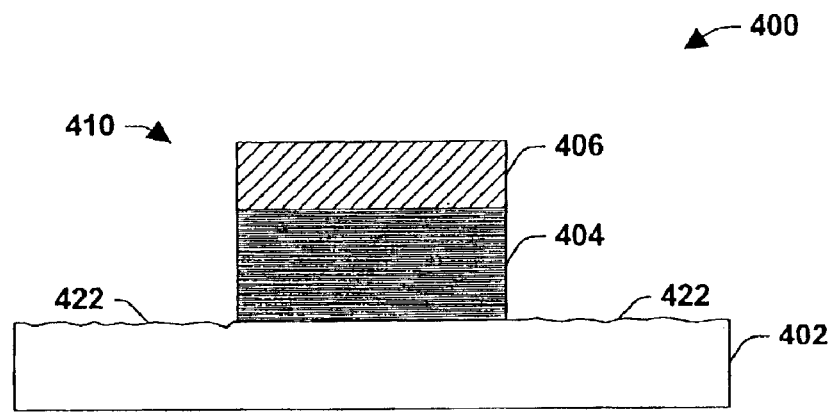

The reflective coating 404 is processed or otherwise patterned to include the integrated circuit pattern formed within the hardmask 406 (FIG. 17). The integrated circuit pattern can, for example, be etched into the reflective coating 404 with the patterned hardmask 406 serving as a guide. It will be appreciated that, after the reflective coating 404 is patterned, the processing can continue briefly such that the substrate 402 can also be processed (e.g., etched) slightly. This roughens a top surface 422 of the substrate 402 making it less reflective to EUV radiation.

Figure 18:
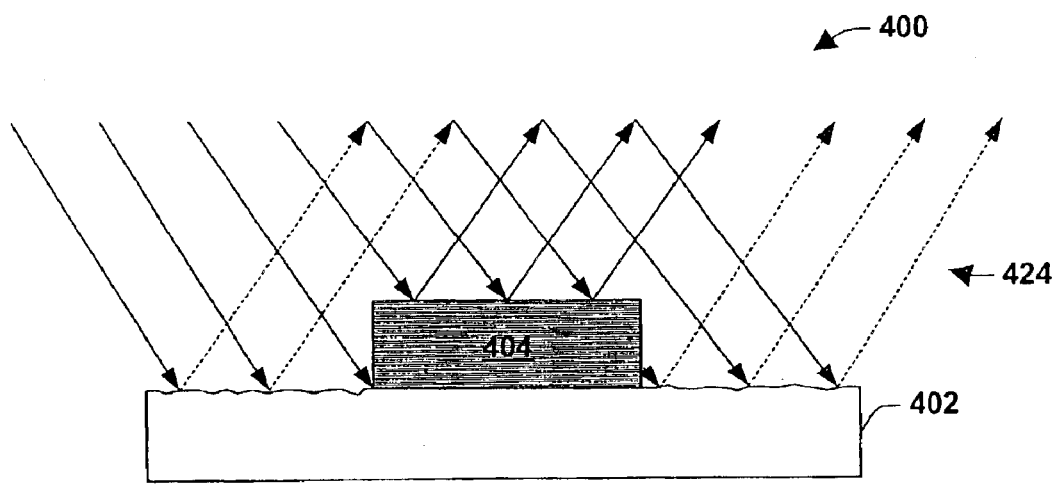
FIG. 18 is a cross-sectional illustration of a reflective mask according to one or more aspects of the present invention and depicts the mask reflecting radiation such as EUV radiation.

The remaining hardmask 406 is then removed (e.g., stripped or washed away) to reveal the usable mask 400 (FIG. 18). At this point, a final capping layer may be deposited over the patterned mask in order to prevent the degradation of the multi-layer reflector due to environmental contaminants or chemical agents. EUV radiation 424 directed at the mask is reflected by the remaining portions of the patterned reflective layer 404 and is absorbed by the substrate 402. The path that radiation directed onto the substrate would take if it were to be reflected by the substrate 402 is depicted for illustrative purposes in phantom. Accordingly, in contrast to conventional masks (FIG. 7), a mask formed in accordance with one or more of the aspects described herein does not comprise dead zones (e.g., 216, 220 in FIG. 7) as it does not include additional EUV absorbing material which can interfere with transmitting the entirety of design features. Such a mask thus provides improved fidelity as compared to conventional masks, for example, the reflective mask of FIG. 7.

Figure 19:
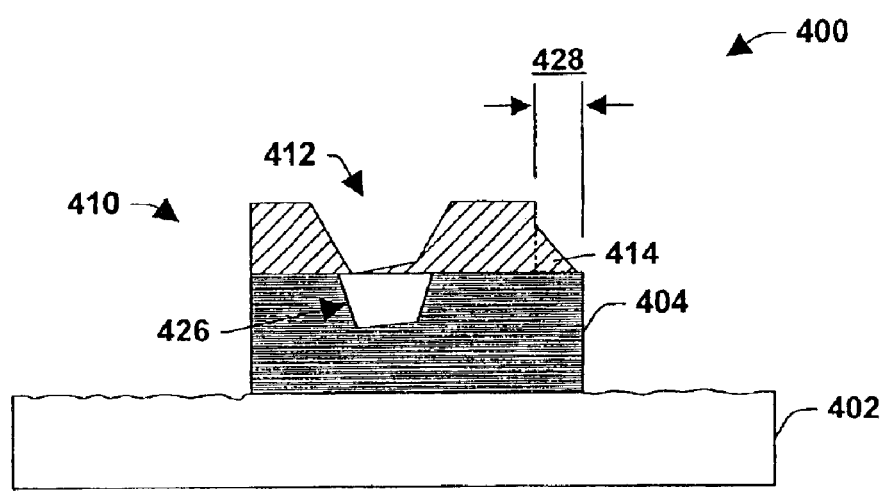
FIG. 19 is a cross-sectional illustration of an EUV reflective mask depicting defects within a masking material utilized in forming the mask, and the transferrence of those defects into an underlying reflective coating within the reflective mask.

Additionally, given that the mask was inspected for defects and that such defects were corrected, the mask 400 will facilitate more accurate pattern transfers. By way of example, should the defects 412, 414 (FIG. 15) not have been properly corrected or repaired, they may have been imparted to the reflective coating 404 during patterning of the reflective coating with the patterned hardmask 406 serving as a guide (FIG. 19). Aperture 412 could, for example, lead to a gap 426 in the reflective coating 404, thereby negatively impacting the reflectivity thereof, while excess material 414 could lead to a larger than intended patterned reflective coating 404 (e.g., by an amount substantially equal to the width 428 of the defect 414). Such defects would thus degrade the fidelity of desired pattern transfers with the mask.

Accordingly, one may now appreciate that one or more aspects of the present invention provide a reflective lithography mask that enhances the fidelity of desired pattern transfers by inspecting for and rectifying defects in a masking material utilized to define desired circuit patterns within a reflective coating within the mask. Although the invention has been shown and described with respect to one or more implementations, equivalent alterations and modifications will occur to others skilled in the art based upon a reading and understanding of this specification and the annexed drawings.

The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of making a reflective lithography mask comprising:

forming a reflective coating that is reflective to lithography radiation on a top surface of a substrate that is substantially absorbent to EUV lithography radiation;

forming a masking material over the reflective coating;

patterning the masking material so as to correspond to a desired circuit layout;

inspecting the masking material for defects therein by
shining a light or a beam of energetic particles at the mask,
detecting an insufficient amount of masking material where an excess amount of particles are scattered from or an excess amount of light is reflected from the reflective coating at locations that are to be covered with masking material, and
detecting unwanted masking material where an insufficient amount of particles are scattered from or an insufficient amount of light is reflected from the reflective coating at locations that are not to be covered with masking material;

rectifying defects found in the masking material;

patterning the reflective coating so as to correspond to the desired circuit layout with the patterned masking material serving as a mask after the defects are rectified; and removing the masking material.

2. The method of claim 1, wherein rectifying defects found in the masking material comprises:

selectively adding masking material to any locations where a deficiency of masking material exists; and selectively removing masking material from any locations where excess masking material is present.

3. The method of claim 2, wherein masking material is selectively added or removed via at least one of an electron beam and an ion beam.

4. The method of claim 1, wherein forming a masking material over the reflective material comprises:

forming a hardmask over the reflective coating; and forming a resist over the hardmask.

5. The method of claim 4, wherein patterning the masking material comprises:

patterning the resist; and patterning the hardmask with the patterned resist serving as a mask.

6. The method of claim 5, wherein the reflective coating is patterned via etching with the patterned hardmask serving as a mask.

7. The method of claim 6, wherein an etchant utilized to etch the reflective coating etches the reflective coating at a rate that is faster than the etchant etches the patterned hardmask.

8. The method of claim 6, further comprising:

etching through the reflective coating so as to etch underlying portions of the top surface of the substrate and roughen those underlying top portions.

9. The method of claim 5, wherein testing the masking material comprises:

shining a light at the mask and analyzing light reflected therefrom after removing the patterned resist from the patterned hardmask.

10. The method of claim 9, wherein rectifying defects found in the masking material comprises:

selectively adding hardmask material to any locations where a deficiency of hardmask material exists; and selectively removing hardmask material from any locations where excess hardmask material is present.

11. The method of claim 4, wherein the hardmask comprises at least one of chrome, Ta, Ti, TaN, W, Al, Cu, C and TaBN.

12. The method of claim 1, further comprising:

forming an underlayer over the top surface of the substrate prior to forming the reflective coating, the underlayer reducing any topographical variations associated with the top surface of the substrate.

13. The method of claim 1, further comprising:

forming a capping layer over the reflective coating prior to forming the masking material.

14. The method of claim 13, wherein the capping layer comprises at least one of silicon, ruthenium, boron carbide and carbon.

15. The method of claim 1, further comprising:

depositing a plurality of layers of one or more EUV reflective materials to form the reflective coating.

16. The method of claim 15, wherein the one or more EUV reflective materials include at least one of silicon, molybdenum, beryllium, ruthenium and boron carbide.

17. The method of claim 15, wherein the layers have respective thicknesses within a range of about 1–10 nm.

18. The method of claim 1, wherein the substrate comprises a low-thermal expansion material (LTEM) or a mixed glass composition of about 92.6 wt. % $SiO_2$ and about 7.4 wt. % $TiO_2$.

19. The method of claim 1, wherein a final capping layer is formed over the patterned mask after the masking material is removed.

20. The method of claim 19, wherein the capping layer comprises at least one of Si, Ru, $B_4C$ and C.

21. A method of making a reflective lithography mask comprising:

forming a reflective coating that is reflective to lithography radiation on a top surface of a substrate that is substantially absorbent to EUV lithography radiation;

forming a hardmask over the reflective coating;

forming a resist over the hardmask;

patterning the resist so as to correspond to a desired circuit layout;

patterning the hardmask with the resist serving as a mask;

removing the resist;

inspecting the hardmask for defects formed therein by
shining a light or a beam of energetic particles at the mask,
detecting an insufficient amount of masking material where an excess amount of particles are scattered from or an excess amount of light is reflected from the reflective coating at locations that are to be covered with masking material, and
detecting unwanted masking material where an insufficient amount of particles are scattered from or an insufficient amount of light is reflected from the reflective coating at locations that are not to be covered with masking material;

rectifying defects found in the hardmask;

patterning the reflective coating so as to correspond to the desired circuit layout with the patterned hardmask serving as a mask after the defects have been rectified; and removing the patterned hardmask.

* * * * *